(12) United States Patent
Sewell

(10) Patent No.: US 7,410,591 B2
(45) Date of Patent: Aug. 12, 2008

(54) METHOD AND SYSTEM FOR MAKING A NANO-PLATE FOR IMPRINT LITHOGRAPHY

(75) Inventor: Harry Sewell, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 245 days.

(21) Appl. No.: 11/012,489

(22) Filed: Dec. 16, 2004

(65) Prior Publication Data

US 2006/0131270 A1    Jun. 22, 2006

(51) Int. Cl.
    *B29D 11/00* (2006.01)
(52) U.S. Cl. .......................... 216/24; 216/11; 264/1.33
(58) Field of Classification Search ................. 216/57, 216/11; 428/848.1, 848.2, 848.3, 848.4, 428/848.5, 848.6, 848.7, 848.8, 848.9
    See application file for complete search history.

(56) References Cited

U.S. PATENT DOCUMENTS

| | | | |
|---|---|---|---|
| 5,669,303 | A | 9/1997 | Maracas et al. |
| 5,772,905 | A | 6/1998 | Chou |
| 6,238,271 | B1 | 5/2001 | Cesna |
| 6,365,059 | B1 | 4/2002 | Pechenik |
| 6,399,173 | B1 * | 6/2002 | Nagayama et al. ......... 428/64.1 |
| 6,482,742 | B1 | 11/2002 | Chou |
| 6,507,456 | B1 * | 1/2003 | Dinan et al. ................ 360/123 |
| 6,518,189 | B1 | 2/2003 | Chou |
| 6,531,202 | B1 * | 3/2003 | Khizroev et al. ............ 428/848 |
| 6,601,629 | B2 | 8/2003 | Betsui et al. |
| 6,656,021 | B2 | 12/2003 | Ota et al. |
| 6,740,209 | B2 | 5/2004 | Shibamoto et al. |
| 6,743,368 | B2 | 6/2004 | Lee |
| 6,757,116 | B1 * | 6/2004 | Curtiss et al. ................ 360/15 |
| 6,809,356 | B2 | 10/2004 | Chou |
| 6,814,898 | B1 | 11/2004 | Deeman et al. |
| 6,869,557 | B1 | 3/2005 | Wago et al. |
| 6,951,173 | B1 | 10/2005 | Meissl et al. |
| 6,964,793 | B2 | 11/2005 | Willson et al. |
| 2002/0114978 | A1 | 8/2002 | Chang et al. |
| 2003/0017424 | A1 | 1/2003 | Park et al. |
| 2003/0091865 | A1 | 5/2003 | Chen et al. |

(Continued)

FOREIGN PATENT DOCUMENTS

EP    0 617 457 A2    9/1994

(Continued)

OTHER PUBLICATIONS

Harry Sewell, U.S. Patent Appl. No. 11/288,135, filed Nov. 29, 2005, entitled "System and Method for Forming Nanodisks Used in Imprint Lithography and Nanodisk and Memory Disk Formed Thereby".

(Continued)

*Primary Examiner*—Roberts Culbert
(74) *Attorney, Agent, or Firm*—Sterne, Kessler, Goldstein & Fox P.L.L.C.

(57) ABSTRACT

Provided is a method and system for manufacturing a nano-plate. The method includes depositing two or more types of film around a central core to form a plurality of film layers, each film layer being of a different type than its adjacent layers. Next, the deposited film layers are sectioned to expose a patterned surface. Finally, the patterned surface is then planarized and selectively etched to form a relief pattern which can be used as an imprint stamp.

10 Claims, 6 Drawing Sheets

U.S. PATENT DOCUMENTS

| | | |
|---|---|---|
| 2003/0104316 A1 | 6/2003 | Wang et al. |
| 2003/0127007 A1 | 7/2003 | Sakurai et al. |
| 2003/0203319 A1* | 10/2003 | Lee .............................. 430/314 |
| 2004/0090610 A1 | 5/2004 | Hatakeyama et al. |
| 2004/0101713 A1 | 5/2004 | Wachenschwanz et al. |
| 2004/0124566 A1 | 7/2004 | Sreenivasan et al. |
| 2004/0132301 A1 | 7/2004 | Harper et al. |
| 2004/0146792 A1 | 7/2004 | Nimmakayala et al. |
| 2004/0169441 A1 | 9/2004 | Choi et al. |
| 2004/0182620 A1 | 9/2004 | Motowaki et al. |
| 2004/0195202 A1 | 10/2004 | Pechenik |
| 2004/0197712 A1 | 10/2004 | Jacobson et al. |
| 2004/0202865 A1 | 10/2004 | Homola et al. |
| 2004/0209123 A1 | 10/2004 | Bajorek et al. |
| 2004/0211755 A1 | 10/2004 | Yusa et al. |
| 2005/0116370 A1 | 6/2005 | Ogino et al. |
| 2005/0118817 A1 | 6/2005 | Fujita et al. |
| 2005/0130074 A1 | 6/2005 | Krause et al. |
| 2005/0133954 A1 | 6/2005 | Homola |
| 2005/0146078 A1 | 6/2005 | Chou et al. |
| 2005/0150862 A1 | 7/2005 | Harper et al. |
| 2005/0151282 A1 | 7/2005 | Harper et al. |
| 2005/0151300 A1 | 7/2005 | Harper et al. |
| 2005/0155554 A1 | 7/2005 | Saito |
| 2005/0156342 A1 | 7/2005 | Harper et al. |
| 2005/0158163 A1 | 7/2005 | Harper et al. |
| 2005/0167847 A1 | 8/2005 | Olsson |
| 2005/0172848 A1 | 8/2005 | Olsson |
| 2005/0191418 A1 | 9/2005 | Bietsch et al. |
| 2005/0212178 A1 | 9/2005 | Nien et al. |
| 2006/0130317 A1* | 6/2006 | Sewell .......................... 29/604 |
| 2006/0130678 A1 | 6/2006 | Sewell |
| 2006/0131785 A1 | 6/2006 | Sewell |
| 2007/0121375 A1 | 5/2007 | Sewell |

FOREIGN PATENT DOCUMENTS

| | | |
|---|---|---|
| EP | 1 072 954 A2 | 1/2001 |
| WO | WO 01/59523 A1 | 8/2001 |
| WO | WO 02/42844 A2 A3 | 5/2002 |
| WO | WO 02/091460 A2 * | 11/2002 |
| WO | WO 02/091460 A2 A3 | 11/2002 |
| WO | WO 2091460 A2 * | 11/2002 |
| WO | WO 03/099463 A2 A3 | 12/2003 |
| WO | WO 2004/013697 A2 A3 | 2/2004 |
| WO | WO 2004/021083 A1 | 3/2004 |
| WO | WO 2004/099879 A2 | 11/2004 |

OTHER PUBLICATIONS

Requirement for Restriction/Election for U.S. Appl. No. 11/012,474, mailed on Jul. 6, 2007.

Non-Final Rejection for U.S. Appl. No. 11/012,598, mailed on Feb. 24, 2006.

Second Final Rejection for U.S. Appl. No. 11/012,598, mailed on Sep. 11, 2007.

Second Non-Final Rejection for U.S. Appl. No. 11/012,598, mailed on Mar. 27, 2007.

First Final Rejection for U.S. Appl. No. 11/012,598, mailed Sep. 21, 2006.

Non-Final Rejection for U.S. Appl. No. 11/224,316, mailed Jul. 3, 2007.

International Search Report and Written Opinion for International Appl. No. PCT/US05/45458 mailed Sep. 4, 2007, 8 pages.

Notice of Allowability for U.S. Appl. No. 11/288,135, mailed Aug. 6, 2007.

Notice of Allowability for U.S. Appl. No. 11/012,598, mailed Nov. 28, 2007.

Notice of Allowability for U.S. Appl. No. 11/224,316, mailed Jan. 2, 2008.

Second Notice of Allowability for U.S. Appl. No. 11/288,135, mailed Dec. 5, 2007.

* cited by examiner

METHOD AND SYSTEM FOR MAKING A NANO-PLATE FOR IMPRINT LITHOGRAPHY

BACKGROUND OF THE INVENTION

1. Field of the Invention

The present invention generally relates to the field of imprint lithography.

2. Related Art

A conventional imprint mask used in nano-imprint technology is generally a quartz or hard surface plate that has been patterned and manufactured using an electron-beam (E-beam) lithography or ion beam lithography pattern writing system. After the required pattern has been written and an image developed in a layer of a resist, the pattern is transferred into the quartz or hard surface using an etch process. A shallow topography is formed in the quartz or hard surface that can be impressed into a plastic medium to give a pattern transfer.

Using the conventional imprint mask manufacturing process, there is a resolution cost issue associated with writing 1× structures less than 30 nanometers (nm) wide. That is, it takes a very long time per square inch to manufacture the mask. Even worse, the manufactured mask may have a severely restricted useful life and it is very difficult to define the 1× imprint masks, even using E-beam technology. This is especially true for patterns having circular symmetry that can be used for imprinting, for example, data tracks onto a data storage disk.

What is needed, therefore, is a method and system for developing a nano-plate for imprint lithography that overcomes the manufacturing challenges associated with traditional imprint masks;

BRIEF SUMMARY OF THE INVENTION

Consistent with the principles of the present invention, as embodied and broadly described herein, the present invention includes a method for manufacturing a nano-plate, for example. The method includes depositing two or more types of film around a central core to form a plurality of film layers, each film layer being of a different type than its adjacent layers. Next, the deposited film layers are sectioned to expose a patterned surface. Finally, the patterned surface is then planarized and selectively etched to expose patterns comprised of one of the types of film to a predetermined depth to produce a selectively etched surface. This plate is then used as a stamp to impress an image of the circular tracks into a resin material. The track pattern is transferred from the resin into the underlying disk material to form a hard drive platen.

Further features and advantages of the present invention as well as the structure and operation of various embodiments of the present invention, as described in detail below with reference to the accompanying drawings.

BRIEF DESCRIPTION OF THE DRAWINGS/FIGURES

The accompanying drawings which are incorporated herein and constitute part of the specification, illustrate embodiments of the present invention and, together with the general description given above and the detailed description of the embodiments given below, serve to explain the principles of the invention. In the drawings.

DETAILED DESCRIPTION OF THE INVENTION

Figure 1:
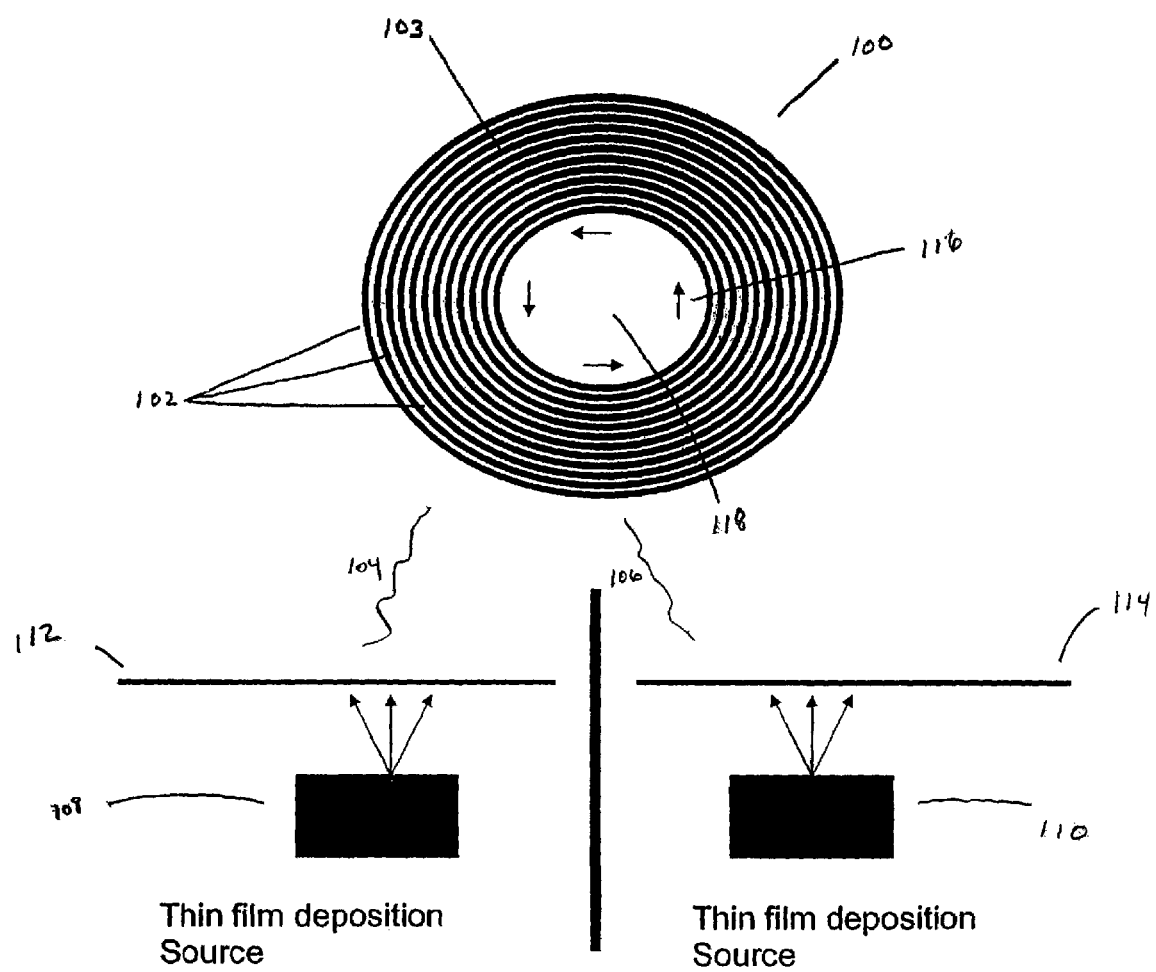
FIG. 1 is an illustration of an apparatus for making an imprint stamp in accordance with an embodiment of the present invention.

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

It would be apparent to one skilled in the art that the present invention, as described below, may be implemented in many different embodiments of hardware and/or the entities illustrated in the drawings. Thus, the operation and behavior of the present invention will be described with the understanding that modifications and variations of the embodiments are possible, given the level of detail presented herein.

FIG. 1 is an illustration of one exemplary technique for making a nano-plate for imprint lithograpy in accordance with an embodiment of the present invention. In FIG. 1, a nano-plate boule 100 is built up, or developed, from hundreds of deposited thin film layers 102 using a layering approach to form, for example, a ring layer structure 103.

The nano-plate boule 100 is constructed by depositing thin films of two or more materials 104 and 106 produced from two or more thin film deposition sources 108 and 110, respectively. The deposition of the materials 104 and 106 is aided by respective shutter assemblies 112 and 114. The materials 104 and 106 are deposited in an alternating manner onto the boule 100 as it rotates in a direction 116 around a central core 118. FIG. 1 illustrates the boule 100 rotating in a counter-clockwise direction for purposes of illustration only. The present invention is in no way limited to counter-clockwise rotation. The central core 118 can be, for example, a solid rod, a hollow cylinder, or other similar structure. An exemplary diameter of the central core 118 might be greater than about 2 millimeters (mm).

In practice, as understood by one of skill in the art, the thin film materials 104 and 106 can be deposited as the nano-plate boule 100 rotates, as shown. Alternatively, however, the deposition sources 108 and 110 can be rotated around the central core 118, to create the circularly symmetrical ring layer structure 103. As illustrated in FIG. 1, the deposited film layers 102 form separate and concentric rings within the layer structure 103.

To form the separate concentric rings within the layer structure 103, during deposition, one of the sources (e.g. the source 108) will switched off while a film comprised of a first of the thin film materials (e.g., material 106) is being deposited by the other source 110. When the film comprised of the first material (106) is completed, its source (110) will be switched off and the second source (108) will be activated to deposit the film comprised of the second material (104). This process continues until the desired thickness of the nano-plate boule 100 is achieved.

Figure 1B:
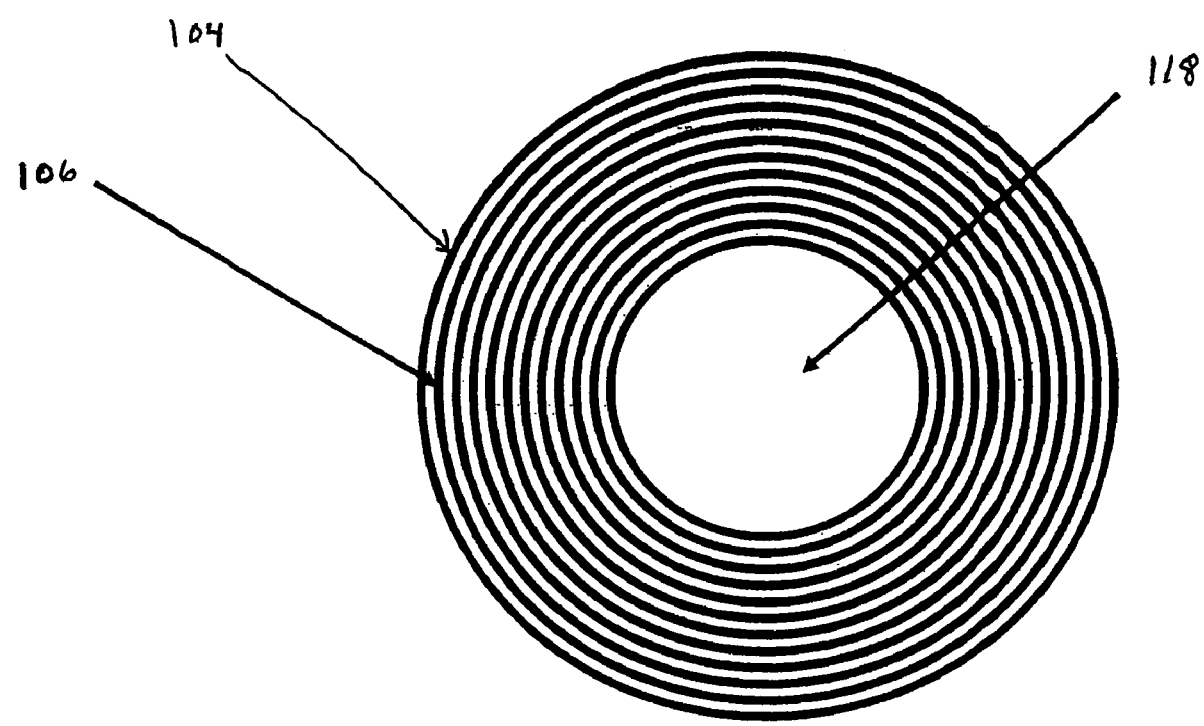
FIG. 1B is a more detailed illustration of a ring structure used within the apparatus illustrated in FIG. 1.

The deposition process noted above ultimately produces alternating layers of the materials 104 and 106, as illustrated in FIG. 1B. The materials 104 and 106 can be comprised of, by way of example, silicon dioxide, silicon nitride, and/or silicon. The materials 104 and 106 can alternatively be comprised of heavy metallic materials, such as tungsten, molybdenum, and tantalum, to name a few.

In the example of FIG. 1, high rate magnetron biased sputtering can be used as the boule 100 rotates. As noted above, however, it can be arranged whereby the sputter sources can be made to rotate around a stationary boule 100. Once the boule 100 has been built up, typically to about 85 to 90 mm in diameter, individual nano-plates can be made by slicing disks off the nano-plate boule 100, using known slicing tools.

Figure 2:
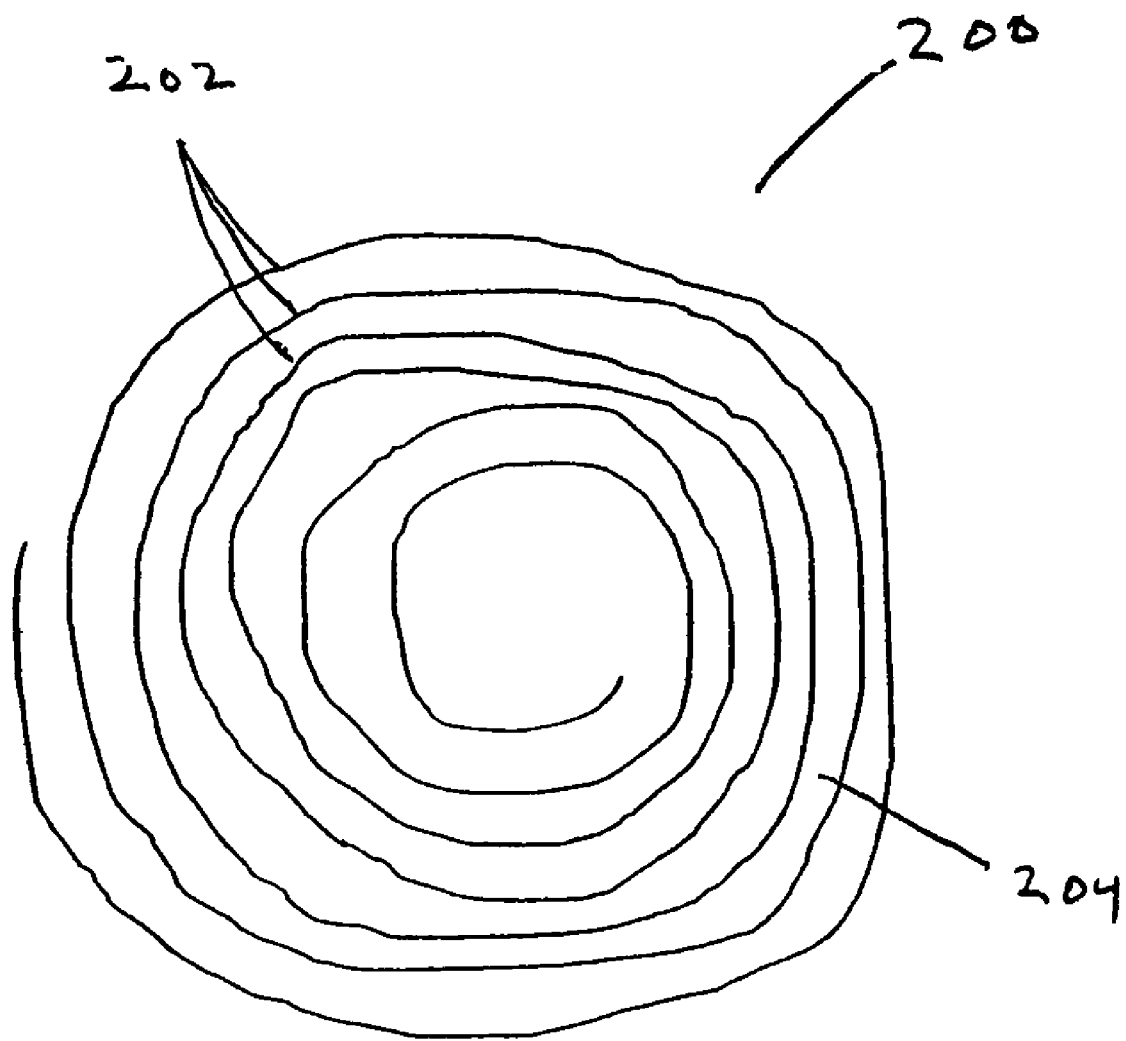
FIG. 2 is an illustration of an alternative to the ring structure of the apparatus shown in FIG. 1.

FIG. 2 is an illustration of an alternative approach to the circularly symmetrical ring layer structure 103 of FIG. 1. In FIG. 2, a nano-plate boule 200 can be developed to have rings 202 that form a spiral structure 204, using a baffled deposition process. To produce the spiral structure 204, for example, each deposition source can be set such that one revolution of the boule produces the required thickness of material. If a single revolution produces the desired thickness of material, then both of the sources, for example, the sources 108 and 110 of FIG. 1, can be on at the same time. That is, each of the sources 108 and 110 would be sequentially depositing one layer on top of the other, around the boule 200 continuously, to form the spiral structure 204.

The thin film deposition process can be accomplished using a variety of methods well known to those of skill in the art. For example, sputter deposition, chemical vapors deposition, plasma vapor deposition or similar thin film deposition systems can be used. Deposition of the materials can be accomplished using two or more deposition sources.

The deposited thin films, such as the thin film layers 102 of FIG. 1, can be made from many material combinations. Within the context of the present invention, it is preferable that one or more of the materials, such as the materials 104 and 106, be selectively etched. Additionally, the materials can be deposited in extremely smooth films, where there is no significant inter-diffusion of the layer during processing that will degrade the definition of the layer thickness. An example of readily available material combinations that can be used to form the discrete layers, and hence the rings are Si02/Si3N4, Si02/Si, Si02/Ta, and Si02/magnetic media. There also are other exemplary suitable combinations not mentioned in the present application, but will become apparent to persons having ordinary skill in the art based on this description.

It is desirable that the deposition process be controlled to provide sufficiently smooth layers such that as the layers build up, there is no deviation from a smooth circular track. For example, bias magnetron sputter deposition can be used to maintain a very smooth deposited film surface while at the same time, achieving a high deposition rate.

Once layers have been built up, nano imprint masks, or nano-plates, can be made by cutting slices out of the boule 100 and polishing the cut surface that will have ring structures resembling, for example, the ring sections of a tree trunk. Each tree ring section cut from the boule 100 undergoes a polishing, or planarizing, process to provide a very flat surface.

After the polishing or planarizing process, a selective etch is used to cut layers comprised of a first of the materials (e.g., 106) selectively against layers comprised of a second of the materials (e.g., 104). The layers are cut to a depth required for an imprint mask, typically about 40 nanometers (nm), for 30 nm lines and spaces.

Figure 3:
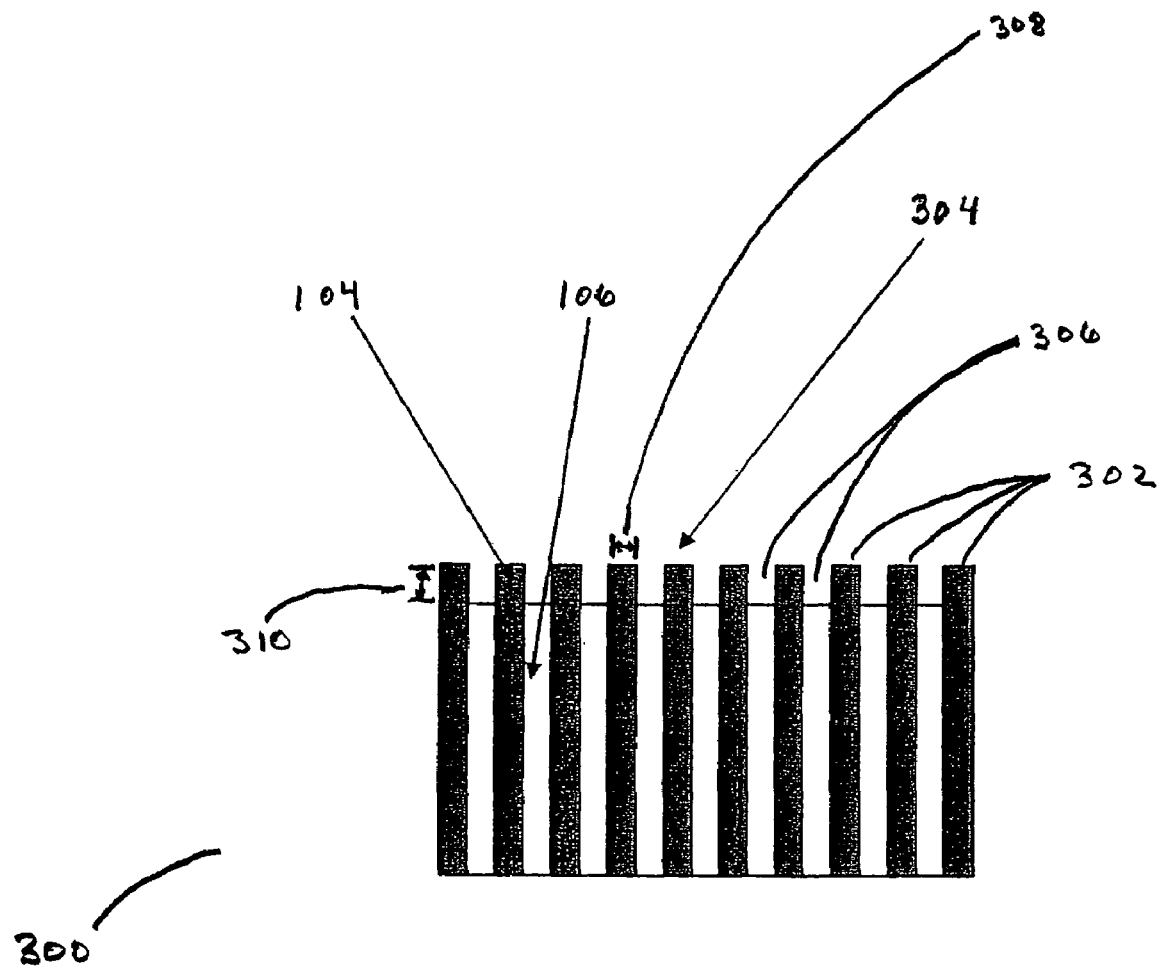
FIG. 3 is a cross-sectional portion of the ring structure illustrated in FIG. 1 in accordance with an embodiment of the present invention.

FIG. 3 is a cross-sectional view of one nano-plate 300 sliced from the circularly symmetrical ring layer structure 103 of the boule 100. In the nano-plate 300, tracks, such as the tracks 302, are formed in a polished nano-plate surface 304 by selectively etching the film layers comprising material 104 against the film layers comprising material 106, as noted above. The tracks 302 are etched to form trenches, such as the trenches 306, in the nano-plate surface 304. A width 308 of the tracks 302 can be within a range of about 1 to 100 nm. A preferable width value is on the order of about 30 nm. The width 308 of the tracks correspond to line and space widths in the context of lithography terminology.

The trenches 306 are formed to a depth 310 of about 45 nm to form the 30 nm lines and spaces, noted above. The etching of the tracks 302 to form the trenches 306 can be accomplished using well known semiconductor etching techniques. For example, a plasma type etcher could be used to reactively etch, or vaporize, the film layers of the material 106 to form the trenches 306.

Figure 4:
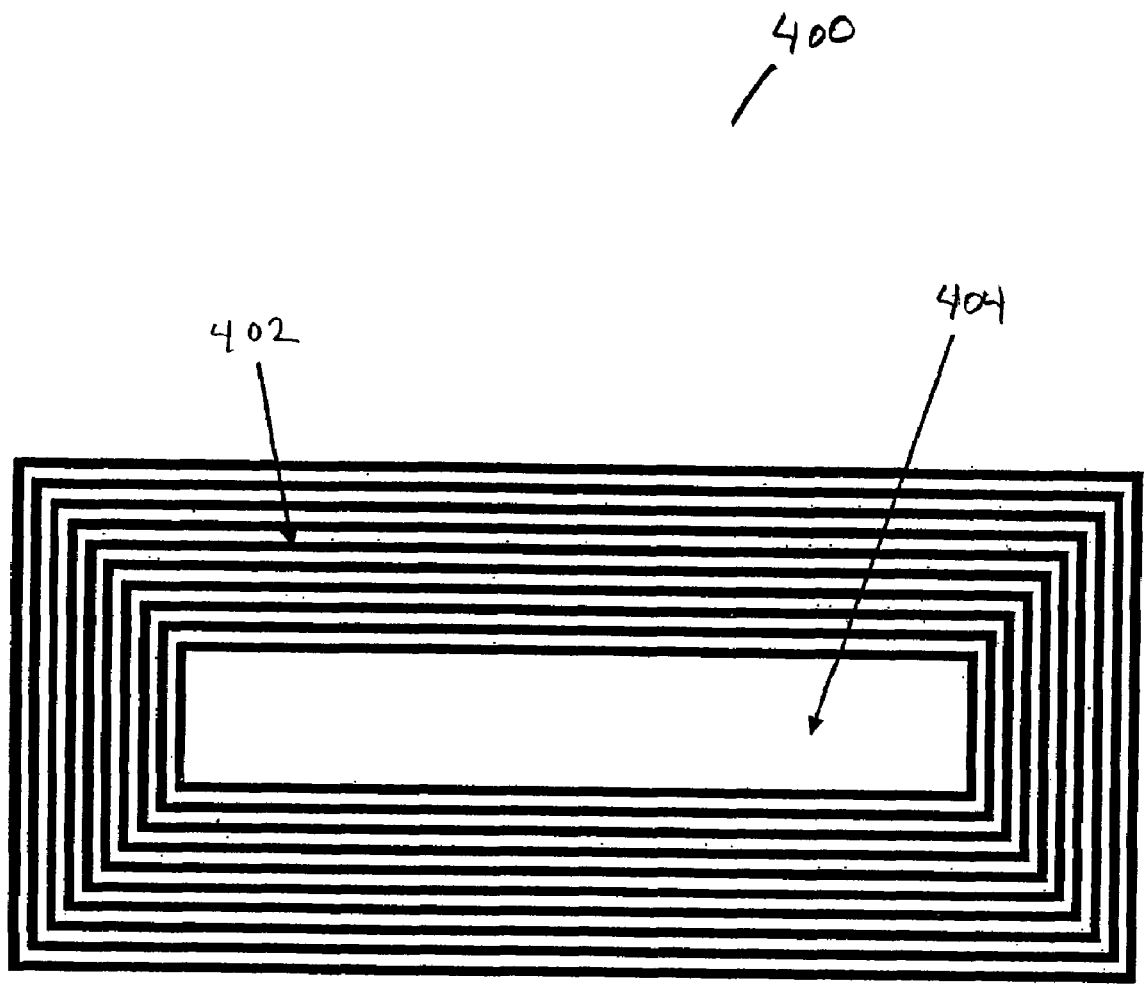
FIG. 4 is an illustration of another alternative to the ring structure of the apparatus shown in FIG. 1.

FIG. 4 is an illustration of an alternative nano-plate structure 400. The alternative nano-plate structure 400 is rectangular in shape as opposed to the circular ring layer structure 103 illustrated in FIG. 1. As in the case of the ring layer structure 103, the rectangular structure 400 includes rectangular film layers 402 formed around a central core 404. The sections of the boule can be cut up in various ways to form stamps with linear or curved tracks.

In the present invention, planarization can be achieved by using standard chemical mechanical polishing (CMP) processes. The planarization or smoothing can also be accomplished by sputter etching, for example, a planarizing resist coating.

As noted above, a nano-plate can be formed having a central hole or bore therethrough, by building the nano-plate boule 100 around a hollow tube, rather than a solid rod (coolant for deposition processing can be passed through the hollow portion of the tube to control the deposition processing temperature).

Typically, quartz is used for the center of the boule although other materials can be used. The final line width and spacing is controlled by the thin layer thickness for the deposited films. Layer thickness is controlled by deposition rate and rotation rates of the boule relative to the sources.

Extremely thin nano-plates can be cut and bonded to carrier plates (not shown) to reduce costs by increasing the number of nano-plates per boule.

To provide format structures on the nano-plate 300, the widths of the rings can be varied in a controlled manner. The formatting structures can be added to the nano-plate 300 to enable the nano-plate 300 to be used as a storage medium. This is achieved by using a lithographic printing process on the platen surface 304, before etching out the tracks 302 to form the trenches 306.

Further to the point of magnetic media applications, the techniques of the present invention are also capable of defining the highest possible track resolutions. Track widths of 10 nm can be defined very uniformly, which is beyond the capabilities of standard optical e-beam lithography. By changing track thicknesses, lithographically printing formatting structures can be defined on the disk 300. This method enables greater than 200 Terabyte hard drive capability.

Figure 5:
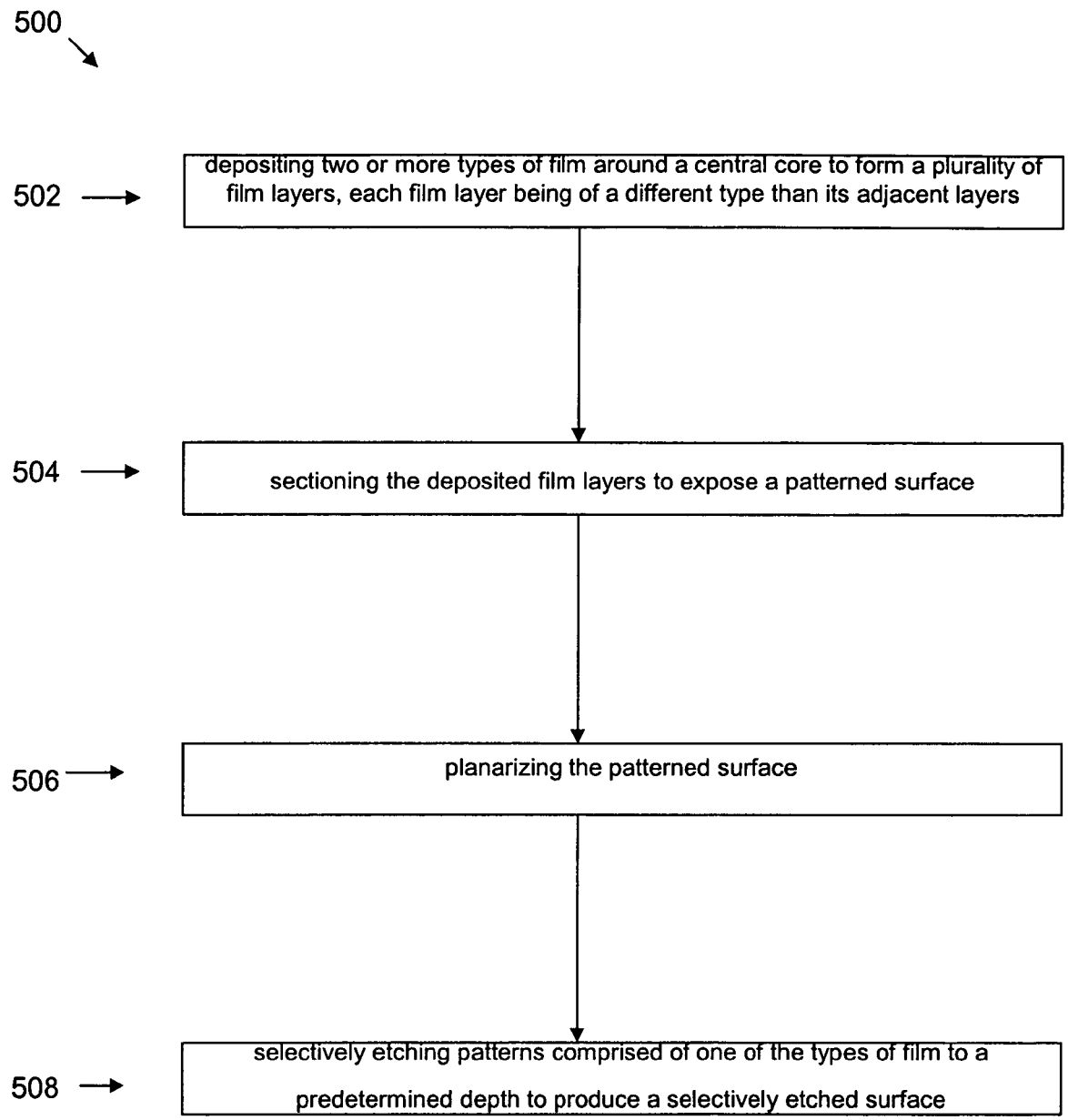
FIG. 5 is a flowchart of an exemplary method of practicing an embodiment of the present invention.

FIG. 5 is a flowchart of an exemplary method 500 of practicing an embodiment of the present invention. In FIG. 5, two or more types of film are deposited around a central core to form a plurality of film layers, as illustrated in step 502. Each film layer being of a different type than its adjacent layers. In step 504, the deposited film layers are sectioned to expose a patterned surface. The patterned surface is then planarized as indicated in step 506 and patterns comprised of one of the types of film are selectively etched to a predetermined depth to produce a selectively etched surface, as indicated in step 508.

CONCLUSION

The present invention is capable of defining the highest possible imprint mask for defining tracks on a data storage medium such as a hard drive. Potential track widths of 10 nm can be defined economically. The present invention also has potential for forming regular die patterns for circles, elipses, and even linear sections. The present invention provides a method for producing large numbers of imprint masks because the boule is sliced to provide a significant number of new identical masks per boule. By controlling the deposition rates, track widths and spacing can be changed at will to provide predefined track layouts.

In cases where the nano-plate is used to define data tracks on a storage medium, it is possible to add additional patterning to the nano-plate that would be typically required by data formatting requirements. The lithographic patterning can be applied to the nano-plate before or after the etch step. Track lines can be interrupted or even removed by this lithography to give an array of format marks. A formatting signature can also be applied to the nano-plate by designing into the deposition sequence layer rings whose thickness is different from the standard ring thickness.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. Thus, the breadth and scope of the present invention should not be limited by any of the above-described exemplary embodiments, but should be defined only in accordance with the following claims and their equivalents.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art.

The Detailed Description section should primarily be used to interpret the claims. The Summary and Abstract sections may set forth one or more, but not all exemplary embodiments of the present invention as contemplated by the inventor(s), and thus, are not intended to limit the claims.

What is claimed is:

1. A method for manufacturing a nano-plate imprint mask, the nano-plate imprint mask being used to make lithographic patterns, comprising:
   depositing two or more types of film onto a surface of a rotating elongated core to form a plurality of film layers, each film layer being a different type of film than its adjacent layers;
   transversely sectioning the elongated core to expose a plurality of patterned surfaces;
   planarizing each of the plurality of patterned surfaces; and
   selectively etching patterns comprised of one of the types of film to a predetermined depth to produce a selectively etched surface.

2. The method of claim 1, wherein the depositing is performed in an annular fashion.

3. The method of claim 2, wherein the annular depositing forms discrete concentric rings.

4. The method of claim 1, wherein the depositing forms a continuous spiral-like structure.

5. The method of claim 1, wherein the two or more types of film include a mixture of hard metals and materials from the group including silicon, silicon dioxide, and silicon nitride.

6. The method of claim 1, wherein the two or more types of film include at least two materials from the group including silicon, silicon dioxide, and silicon nitride.

7. The method of claim 1, wherein the two or more types of film include at least two different heavy metal materials.

8. The method of claim 1, wherein each layer has a thickness of equal to or less than 30 nanometers.

9. The method of claim 1, wherein each layer has a thickness within a range of about 1 to 100 nanometers.

10. The method of claim 1, wherein the elongated core comprises a solid rod, a hollow cylinder, or a rectangular core.

* * * * *